Figure 1:
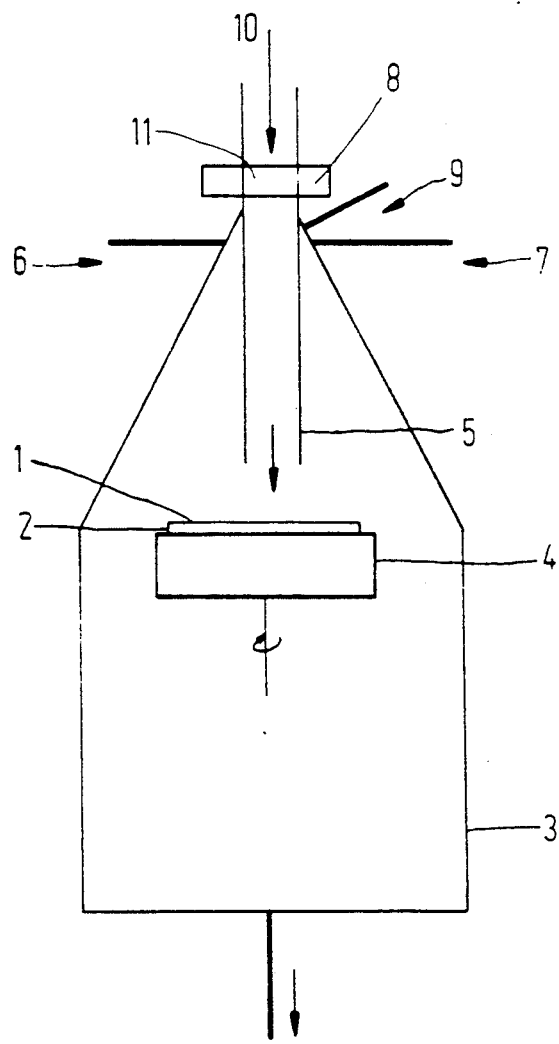

United States Patent [19]
De Keijser et al.

[11] Patent Number: 5,178,718
[45] Date of Patent: Jan. 12, 1993

[54] METHOD OF MANUFACTURING A SEMICONDUCTOR DEVICE

[75] Inventors: Marco S. De Keijser; Christianus J. M. Van Opdorp, both of Eindhoven, Netherlands

[73] Assignee: U.S. Philips Corporation, New York, N.Y.

[21] Appl. No.: 679,973

[22] Filed: Apr. 3, 1991

[30] Foreign Application Priority Data

Apr. 24, 1990 [NL] Netherlands .................. 9000973

[51] Int. Cl.$^5$ .................................... C30B 25/00
[52] U.S. Cl. ...................... 156/614; 156/610; 156/DIG. 70; 422/245; 437/107; 437/108; 437/937
[58] Field of Search ............. 156/610, 614, DIG. 70; 422/245

[56] References Cited

U.S. PATENT DOCUMENTS

| | | | |
|---|---|---|---|
| 3,146,137 | 8/1964 | Ballwin | 156/614 |
| 3,218,205 | 11/1965 | Ruehrwein | 156/614 |
| 4,062,706 | 12/1977 | Ruehrwein | 156/614 |
| 4,368,098 | 1/1983 | Manasevit | 156/614 |
| 4,767,494 | 8/1988 | Kobayashi et al. | 156/613 |
| 4,793,872 | 12/1988 | Meunier et al. | 156/613 |
| 4,902,643 | 2/1990 | Shimawaki | 156/613 |

FOREIGN PATENT DOCUMENTS 0282075  9/1988  European Pat. Off. ............ 156/613

Primary Examiner—Robert Kunemund
Assistant Examiner—Felisa Garrett
Attorney, Agent, or Firm—Paul R. Miller

[57] ABSTRACT

The invention relates to a method of manufacturing a semiconductor device by means of a cyclical epitaxial process from a gas phase by which alternate monoatomic layers of the III atom and the V atom of a III-V compound are formed. Layers of very good quality are obtained when atomic hydrogen is conducted to the substrate on which epitaxial growth takes place during a part of each cycle in which the gas phase is free from a compound of the III atom.

6 Claims, 1 Drawing Sheet

METHOD OF MANUFACTURING A SEMICONDUCTOR DEVICE

The invention relates to a method of manufacturing a semiconductor device in which an epitaxial growth from a gas phase is carried out on a surface of a monocrystalline substrate, which growth consists at least in part of a process comprising several cycles, in which subsequently for each cycle one monoatomic layer of at least one of the elements aluminium, gallium, and indium belonging to the group III of the periodic system and one monoatomic layer of at least one of the elements nitrogen, phosphorus, arsenic, and antimony belonging to the group V of the periodic system are formed.

The growth of layers of gallium arsenide and gallium aluminium arsenide by means of the method mentioned in the opening paragraph is known from an article by A. Doi, Y Aoyagi and S. Namba in Appl. Phys. Lett. 49 (13), Sep. 29, 1986, pp. 785–787.

According to this publication, the growth of good atomic layers may be promoted by laser irradiation of the surface on which the monoatomic gallium layer is formed.

The known method has the drawback that the surface area on which epitaxial growth is carried out is very restricted for practical reasons when laser irradiation is used. Also high temperatures may occur temporarily during laser irradiation, so that undesirable diffusion in the solid phase is possible. Laser irradiation in the presence of one or more compounds of group III elements in the gas phase has the drawback that premature dissociation can take place so that there is a risk that more than one monoatomic layer of the group III elements is formed in one cycle.

The invention has for its object inter alia to avoid at least to a substantial degree the drawbacks referred to.

According to the invention, therefore, the method described in the opening paragraph is characterized in that atomic hydrogen is conducted to the surface of the substrate during part of each cycle, more particularly a part of each cycle in which the gas phase is free from compounds of group III elements.

The invention is based inter alia on recognition that the use of atomic hydrogen makes it possible to choose a temperature so low that dissociation of a compound of an element of the III group, for example gallium, during the supply of this compound is avoided both in the gas phase and on the surface, while conversion to the III element takes place in another part of the cycle than the one in which the atomic hydrogen is supplied, so that deposition of the III element is restricted to monoatomic layers.

An advantage of the method according to the invention is that the epitaxy can be carried out in a wide temperature range on a large substrate surface area without temporary temperature rises occurring during which diffusion in the solid phase takes place. Monoatomic layers of gallium and arsenic are preferably chosen. The cyclical process is carried out in this case at a temperature of 400° to 500° C.

The invention will now be explained with reference to an example and the accompanying drawing.

In the drawing

Figure 2:
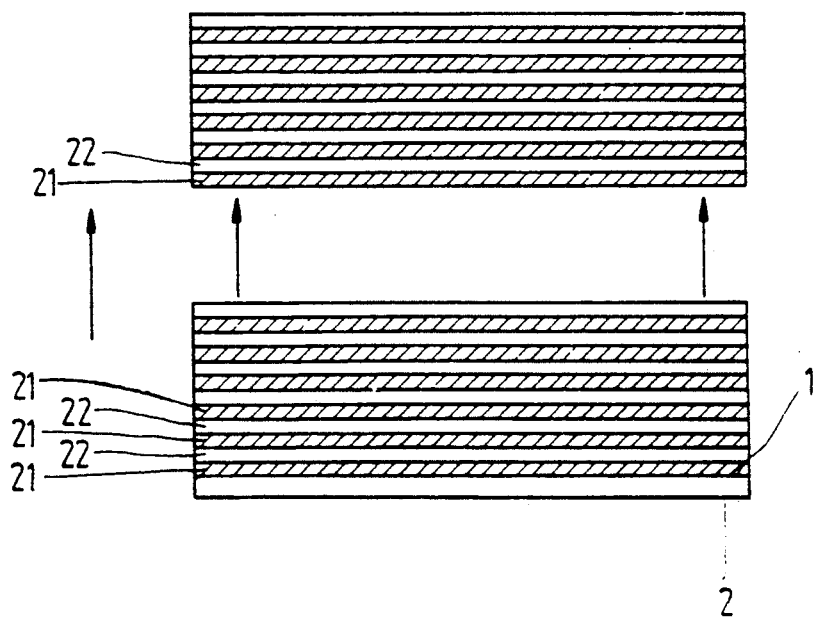

FIG. 1 diagrammatically and in cross-section represents part of a device for carrying out the method according to the invention, and FIG. 2 diagrammatically and in cross-section represents part of a semiconductor device in a stage of manufacture by the method according to the invention.

The present invention concerns a method of manufacturing a semiconductor device by which an epitaxial growth on a surface 1 of a monocrystalline substrate 2 is carried out from a gas phase (see FIG. 1). The growth consists of a process which comprises at least in part several cycles, in which for each cycle subsequently one monoatomic layer 21 (see FIG. 2) of at least one of the elements aluminium, gallium and indium belonging to the group III of the periodic system and one monoatomic layer 22 of at least one of the elements nitrogen, phosphorus, arsenic and antimony belonging to the group V of the periodic system are formed.

The epitaxial growth may be carried out on a relatively large substrate surface area 2 if, according to the invention, during part of each cycle, more particularly a part in which the gas phase is free from compounds of the group III elements, atomic hydrogen is conducted to the surface 1 of the substrate 2.

The method according to the invention is carried out, for example, in the device shown in FIG. 1. This device or reactor consists of a quartz tube 3 with an inductively heated silicon susceptor 4 (diameter=32 mm).

A quartz tube 5 (inner diameter=8 mm), called plasma tube hereinafter, projects into the reactor, it being possible to generate a plasma 11 in the plasma tube by means of a microwave generator (Mikrotron 200; 2.45 GHz; 200 W). The reactive particles made in this plasma (if hydrogen flows through it: atomic hydrogen) are conducted through the plasma tube directly to the surface 1 of the substrate 2 on the susceptor 4.

The system is so designed that a quick switch-over from rare gas to hydrogen and vice versa is possible through this plasma tube.

The basis is formed by a gallium arsenide substrate 2 (Sumitomo orientation [001]2° off. (110) ±0.50°, N-type, Si-doped $1.0-4.0 \times 10^{18}$ cm$^{-3}$, etching pit density $\leq 2.0 \times 10^3$ cm$^{-2}$), which is cleaned by a usual method.

Growth components for gallium layers 21 and arsenic layers 22 are trimethyl gallium (Ga(CH$_3$)$_3$) and arsine (AsH$_3$), both included in usual fashion in purified hydrogen by way of carrier gas. They are introduced at the top of the reactor (at 6 and 7) and do not pass through the plasma. The main hydrogen flow is introduced at 9 and does not pass through the plasma either.

When the substrate has been put on the susceptor 4, the reactor is brought to a pressure of 23 torr, the susceptor is rotated at a rate of 40 rpm and hydrogen flushing takes place for approximately 30 minutes at 2 slm (standard liters per minute).

The following process parameters are used in a cycle:
a) a permanent main flow 9 of hydrogen of 1250 sccm.
b) a gas flow 10 through the plasma tube, consisting of 960 sccm helium, except if atomic hydrogen is required, in which case the gas flow 10 consists of 1170 sccm hydrogen.
c) a partial AsH$_3$ pressure in the reactor of 0.11 torr (AsH$_3$ mole flux $518 \times 10^{-6}$ mole/min).
d) a partial Ga(CH$_3$)$_3$ pressure of 0.011 torr (Ga(CH$_3$)$_3$ mole flux = $51 \times 10^{-6}$ mole/min).

The susceptor is brought to a growth temperature of 440° C. and the plasma 11 is ignited. Helium flows through the plasma. The microwave cavity is cooled with compressed air 8.

A cycle now comprises:
1. 2 seconds AsH$_3$ feed 2. 15 seconds flushing with the hydrogen flow 9 and the helium flow 10
3. 6 seconds Ga(CH$_3$)$_3$ feed
4. 20 seconds flushing with the hydrogen flow 9 and the helium flow 10
5. 3 seconds feed of H (atomic hydrogen), the flow 10 now consisting of hydrogen
6. 3 seconds flushing with the hydrogen flow 9 and the helium flow 10.

The total cycle duration is 49 seconds and the total growth time for 200 cycles, therefore, is approximately 2.45 hours. The total thickness of 200 layers is 56.6 nm.

Throughout the cycle, helium flows through the plasma, except during step 5 when hydrogen flows through the plasma.

The plasma is extinguished when the growth has ended. A particularly good control of the layer thickness and a very good homogeneity of the layer thickness are obtained with the method according to the invention.

The method according to the invention is very suitable for the manufacture of, for example, uniform quantum wells.

The invention is not limited to the example given but may be varied in many ways by those skilled in the art within the scope described.

Thus, for example, instead of layers of gallium arsenide, layers may be formed comprising layers of aluminium arsenide or of gallium aluminium arsenide consisting of monoatomic layers. During the epitaxial growth process, moreover, the composition per cycle may change, or, alternatively, the entire process of the multicyclical growth may be included in a usual process of epitaxial growth in which layers having a thickness in the order of 1 μm are grown.

We claim:

1. A method of manufacturing a semiconductor device by epitaxial growth from a gas phase comprising the steps of (a) providing a monocrystalline substrate on a susceptor, and (b) carrying out a number of growth cycles on a surface of said substrate to form alternate monoatomic layers of group III and group V elements by forming in each cycle a monoatomic layer of said group III element and a monoatomic layer of said group V element, and by separately flowing only atomic hydrogen over said surface for part of each cycle.

2. A method according to claim 1, wherein during each cycle the following steps are carried out:

(i) feeding said group V element for a first period of time, (ii) flushing with a helium plasma and a separate hydrogen flow for a second period of time, (iii) feeding said group III element for a third period of time, (iv) flushing with said helium plasma and said separate hydrogen flow for a fourth period of time, (v) feeding a plasma of only said atomic hydrogen for a fifth period of time, and (vi) flushing with said helium plasma and said separate hydrogen flow for a sixth period time.

3. A method according to claim 2, wherein said group III element is formed of at least one of aluminum, gallium, and indium, and wherein said group V element is formed of at least one of nitrogen, phosphorus, arsenic, and antimony.

4. A method according to claim 2, wherein said each cycle is carried out at a temperature ranging from 400° to 500° C.

5. A method according to claim 1, wherein said group III element is formed of gallium and said group V element is formed of arsenic.

6. A method according to claim 1, wherein said each cycle is carried out at a temperature ranging from 400° to 500° C.

* * * * *